United States Patent
Zhang et al.

(10) Patent No.: US 11,877,501 B2
(45) Date of Patent: Jan. 16, 2024

(54) POST-PROCESSING METHOD OF QUANTUM DOT LIGHT-EMITTING DIODE

(71) Applicant: TCL Technology Group Corporation, Huizhou (CN)

(72) Inventors: Jie Zhang, Huizhou (CN); Chaoyu Xiang, Huizhou (CN)

(73) Assignee: TCL Technology Group Corporation, Huizhou (CN)

( * ) Notice: Subject to any disclaimer, the term of this patent is extended or adjusted under 35 U.S.C. 154(b) by 322 days.

(21) Appl. No.: 17/419,647

(22) PCT Filed: Sep. 17, 2019

(86) PCT No.: PCT/CN2019/106142
§ 371 (c)(1),
(2) Date: Jun. 29, 2021

(87) PCT Pub. No.: WO2020/134207
PCT Pub. Date: Jul. 2, 2020

(65) Prior Publication Data
US 2022/0077393 A1    Mar. 10, 2022

(30) Foreign Application Priority Data
Dec. 29, 2018 (CN) .......................... 201811635589.7

(51) Int. Cl.
*H01L 51/00* (2006.01)
*H10K 71/40* (2023.01)
(Continued)

(52) U.S. Cl.
CPC ........... *H10K 71/40* (2023.02); *H10K 50/115* (2023.02); *H10K 50/81* (2023.02); *H10K 50/828* (2023.02);
(Continued)

(58) Field of Classification Search
CPC ....... H01L 33/06; H01L 33/26; H01L 33/005; B82Y 20/00; B82Y 40/00; B82Y 35/00; B82Y 30/00
See application file for complete search history.

(56) References Cited

U.S. PATENT DOCUMENTS 7,537,947 B2    5/2009  Smith et al.
8,476,820 B2    7/2013  Carroll et al.
(Continued)

FOREIGN PATENT DOCUMENTS

CN    1698088 A     11/2005
CN    101568617 A   10/2009
(Continued)

OTHER PUBLICATIONS

International Search Report for PCT/CN2019/106142; Date of Completion: Nov. 26, 2019; dated Dec. 17, 2019; 6 Pages, English Translation Included.
(Continued)

*Primary Examiner* — Jaehwan Oh

(57) ABSTRACT

A post-processing method of a quantum dot light-emitting diode, which includes the following steps: providing a quantum dot light-emitting diode, the quantum dot light-emitting diode includes a cathode and an anode arranged oppositely, and a quantum dot light-emitting layer arranged between the cathode and the anode; energizing the cathode and anode of the quantum dot light-emitting diode, and performing a light irradiation treatment on the quantum dot light-emitting diode.

16 Claims, 1 Drawing Sheet

Providing a quantum dot light-emitting diode, which includes a cathode and an anode disposed oppositely, and a quantum dot light-emitting layer arranged between the cathode and the anode — S01

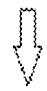

Energizing the cathode and anode of the quantum dot light-emitting diode, and performing a light irradiation treatment on the quantum dot light-emitting diode — S02

(51) Int. Cl.
  *H10K 50/81* (2023.01)
  *H10K 50/115* (2023.01)
  *H10K 50/828* (2023.01)
  *H10K 71/00* (2023.01)
  *H10K 102/00* (2023.01)

(52) U.S. Cl.
  CPC ....... *H10K 71/00* (2023.02); *H10K 2102/351* (2023.02)

(56) References Cited

U.S. PATENT DOCUMENTS

| | | | |
|---|---|---|---|
| 8,574,685 B1* | 11/2013 | Lewis | H10K 30/10 427/75 |
| 10,084,103 B1* | 9/2018 | Lewis | H01L 31/035218 |
| 2020/0295100 A1* | 9/2020 | Liu | H10K 59/1213 |
| 2022/0127527 A1* | 4/2022 | Zhang | H10K 59/35 |

FOREIGN PATENT DOCUMENTS

| | | |
|---|---|---|
| CN | 102842686 A | 12/2012 |
| CN | 203785842 U | 8/2014 |
| CN | 104157671 A | 11/2014 |
| CN | 105280829 A | 1/2016 |
| CN | 106058065 A | 10/2016 |
| CN | 106409995 A | 2/2017 |
| CN | 108054295 A | 5/2018 |
| CN | 108767129 A | 11/2018 |
| CN | 108832011 A | 11/2018 |
| CN | 108832014 A | 11/2018 |
| EP | 2912453 B1 | 6/2016 |
| JP | 2003257651 A | 9/2003 |
| JP | 2016065178 A | 4/2016 |
| JP | 2017048355 A | 3/2017 |
| KR | 101925010 B1 | 12/2018 |
| WO | 2009002760 A2 | 12/2008 |
| WO | 2014063725 A1 | 5/2014 |

OTHER PUBLICATIONS

Written Opinion for PCT/CN2019/106142; International Filing Date: Sep. 17, 2019; dated Dec. 17, 2019; 6 Pages, English Translation Included.
Extended EP Search Report dated Apr. 20, 2022; EP Application No. 19906324.9; 8 pages.
First Office Action; CN Application No. 201811635589.7; 3 pages (non-English).
First Office Action; CN Application No. 201811635589.7; 4 pages (English).
Grant Notice; CN Application No. 201811635589.7; 1 page (non-English).
Grant Notice; CN Application No. 201811635589.7; 2 pages (English).
Search Report; CN Application No. 201811635589.7; 2 pages.
Second Office Action; CN Application No. 201811635589.7; 3pages (non-English).
Second Office Action; CN Application No. 201811635589.7; 4 pages (English).

* cited by examiner

Providing a quantum dot light-emitting diode, which includes a cathode and an anode disposed oppositely, and a quantum dot light-emitting layer arranged between the cathode and the anode — S01

Energizing the cathode and anode of the quantum dot light-emitting diode, and performing a light irradiation treatment on the quantum dot light-emitting diode — S02

POST-PROCESSING METHOD OF QUANTUM DOT LIGHT-EMITTING DIODE

CROSS REFERENCE TO RELATED APPLICATIONS

This application is the national phase entry of International Application No. PCT/CN2019/106142, filed on Sep. 17, 2019, which is based upon and claims priority to Chinese Patent Application No. 201811635589.7, filed on Dec. 29, 2018, the entire contents each of which are incorporated herein by reference.

TECHNICAL FIELD

The present application relates to the field of display technology, in particular to a post-processing method of a quantum dot light-emitting diode.

BACKGROUND

Quantum dots, also known as semiconductor nanocrystals, whose three-dimensional size is within the nanometer range (1-100 nm), is a kind of nanoparticle theory between bulk phase materials and molecules. Quantum dots have excellent optical properties such as high quantum yield, large molar extinction coefficient, good optical stability, narrow half-peak width, wide excitation spectrum and controllable emission spectrum, etc., and are very suitable for use as luminescent materials for light-emitting devices. In recent years, quantum dot fluorescent materials have been widely used in the field of flat panel displays due to their high light color purity, adjustable luminous color, and long service life, becoming a promising next-generation display and solid-state lighting source. The Quantum Dot light-emitting diode (QLED) is a light-emitting device based on quantum dot material as a luminescent material. Due to its advantages such as adjustable wavelength, narrow emission spectrum, high stability, and high quantum yield of electroluminescence, etc., it has become a strong competitor in the next a generation of display technology.

However, the existing post-processing method of a quantum dot light-emitting diode still need to be improved.

Technical Problem

In a process of preparing the QLED device, due to the material difference between functional layers, inevitably, this leads to a certain problem of compatibility between adjacent layers. In order to better improve the stability and efficiency of the QLED device, it is usually necessary to perform a long time energization curing process on the QLED device after the preparation of each functional layer of the QLED device, so as to achieve the efficiency of device. However, the time required for the curing process is too long, which seriously affects the production period of the QLED device; at the same time, the effect on improving the efficiency of the device is not obvious.

One of the purposes of the embodiments of the present application is to provide a post-processing method of a quantum dot light-emitting diode, which aims to solve the problem that the existing post-processing method for quantum dot light-emitting diodes takes too long and has no obvious effect on improving the efficiency of quantum dot light-emitting diode devices.

TECHNICAL SOLUTIONS

In order to solve the above technical problems, the technical solutions adapted in the embodiments of this application are as follows:

In the first aspect, a post-processing method of a quantum dot light-emitting diode is provided, which includes the following steps:

providing a quantum dot light-emitting diode, the quantum dot light-emitting diode includes a cathode and an anode disposed oppositely, and a quantum dot light-emitting layer arranged between the cathode and the anode;

energizing the cathode and anode of the quantum dot light-emitting diode, and performing a light irradiation treatment on the quantum dot light-emitting diode.

In one embodiment, a light source applied in the light irradiation treatment is selected from ultraviolet light with an emission wavelength of 100-400 nm and/or visible light with an emission wavelength of 400-500 nm.

In an embodiment, the quantum dot light-emitting diode is subjected to the light irradiation treatment, and an illuminance of the light source applied in the light irradiation treatment is between 500 lx and 50000 lx.

In one embodiment, the quantum dot light-emitting diode is subjected to the light irradiation treatment, and the illuminance of the light source applied in the light irradiation treatment is between 2000 lx and 10000 lx.

In one embodiment, the cathode or anode of the quantum dot light-emitting diode is configured as a transparent electrode, and the light source for the light irradiation treatment is arranged at a side close to the transparent electrode.

In one embodiment, the cathode and anode of the quantum dot light-emitting diode are energized, and the light irradiation treatment of the quantum dot light-emitting diode is performed in a sealed cavity, and a material for an inner wall surface of the sealed cavity is a material with light reflection performance.

In one embodiment, the cathode and anode of the quantum dot light-emitting diode are energized, and the time for light-irradiating the quantum dot light-emitting diode is 20 minutes to 48 hours.

In one embodiment, the cathode and anode of the quantum dot light-emitting diode are energized, and the time for light-irradiating the quantum dot light-emitting diode is 10 hours-20 hours.

In one embodiment, the steps of energizing the cathode and anode of the quantum dot light-emitting diode, and performing the light irradiation treatment on the quantum dot light-emitting diode at a temperature of −40° C. to 40° C.

In one embodiment, the steps of energizing the cathode and anode of the quantum dot light-emitting diode, and performing the light irradiation treatment on the quantum dot light-emitting diode at the temperature of 0° C. to 30° C.

In one embodiment, at least one of the cathode and the anode is a transparent electrode.

In one embodiment, the quantum dot light-emitting diode further includes an electron function layer arranged between the cathode and the quantum dot light-emitting layer, where the electron function layer includes at least one of an electron injection layer, an electron transport layer and a hole barrier layer.

In one embodiment, the quantum dot light-emitting diode further includes a hole function layer arranged between the anode and the quantum dot light-emitting layer, where the hole function layer includes at least one of a hole injection layer, a hole transport layer, and an electron barrier layer.

In one embodiment, the quantum dot light-emitting diode includes both a hole function layer and an electron function layer.

In one embodiment, the quantum dot light-emitting diode includes a cathode and an anode disposed oppositely, a quantum dot light-emitting layer arranged between the cathode and the anode, and an electron injection layer and a electron transport layer arranged between the cathode and the quantum dot light-emitting layer, a hole injection layer and a hole transport layer arranged between the anode and the quantum dot light-emitting layer, where the electron injection layer is disposed adjacent to the cathode, the electron transport layer is disposed adjacent to the quantum dot light-emitting layer, the hole injection layer is disposed adjacent to the anode, and the hole transport layer is disposed adjacent to the quantum dot light-emitting layer.

The post-processing method of the quantum dot light-emitting diode provided by the embodiments of the present application has the beneficial effect in that: By placing the quantum dot light-emitting diode in an environment with a light source, energizing the cathode and anode of the quantum dot light-emitting diode, and performing a light irradiation treatment on the quantum dot light-emitting diode, it can not only effectively improve the curing efficiency and shorten the production period of the quantum dot light-emitting diode; moreover, the quantum dot light-emitting diode obtained by the curing process under the above conditions has better luminous efficiency of the device. Specifically, on the one hand, compared with the curing process under non-illuminated conditions, the present application of the curing process under illumination conditions can reduce the time taken to achieve the same external quantum efficiency (EQE) by at least 50%, or even 90%. On the other hand, in the present application, the cathode and anode of the quantum dot light-emitting diode are energized, and the external quantum efficiency of the quantum dot light-emitting diode obtained after the quantum dot light-emitting diode is subjected to light irradiation treatment is improved, which can reach 6.6%, and then the luminous efficiency of the quantum dot light-emitting diode device can be effectively improved. More importantly, the curing time required for the quantum dot light-emitting diode described in the present application to reach the external quantum efficiency of 6.6% is (at most) only 30% of the time required for curing process under non-illuminated conditions to reach the highest external quantum efficiency.

BRIEF DESCRIPTION OF DRAWINGS

In order to explain the technical solution in the embodiments of the present application more clearly, the drawings used in the embodiments or exemplary technical descriptions will be briefly described hereinbelow. Obviously, the drawings in the following description are some embodiments of the present application, and for persons skilled in the art, other drawings may also be obtained on the basis of these drawings without any creative work.

FIG. 1 is a flowchart of a post-processing method of a quantum dot light-emitting diode in accordance with an embodiment of the present application.

DETAILED DESCRIPTION OF THE EMBODIMENTS

In order to make the objectives, technical solutions, and advantages of the present application more comprehensible, the following further describes the present application in detail with reference to the drawings and embodiments. It should be understood that the specific embodiments described here are merely used to illustrate the present application, and are not intended to limit the present application.

It should be noted that the terms "first" and "second" are merely used for descriptive purposes, and cannot be understood as indicating or implying relative importance or implicitly indicating the number of indicated technical features. Thus, the features defined with "first" and "second" may explicitly or implicitly include one or more of these features. In the description of the present application, "multiple" means two or more than two, unless otherwise specifically defined.

In order to illustrate the technical solutions described in the present application, the detailed description will be given below in conjunction with specific drawings and embodiments.

As shown in FIG. 1, some embodiments of the present application provide a post-processing method of a quantum dot light-emitting diode, which includes the following steps:

S01. Providing a quantum dot light-emitting diode, the quantum dot light-emitting diode includes a cathode and an anode disposed oppositely, and a quantum dot light-emitting layer arranged between the cathode and the anode;

S02. Energizing the cathode and anode of the quantum dot light-emitting diode, and performing a light irradiation treatment on the quantum dot light-emitting diode.

In the post-processing method of the quantum dot light-emitting diode provided by the embodiments of the present application, the quantum dot light-emitting diode is placed in an environment provided with a light source, the cathode and anode of the quantum dot light-emitting diode is energized, and the quantum dot light-emitting diode is subjected to a light irradiation treatment, which not only can effectively improve the curing efficiency and shorten the production period of the quantum dot light-emitting diode; moreover, the quantum dot light-emitting diode obtained after the curing process under the above light conditions has a better luminous efficiency of the device. Specifically, on the one hand, compared to a curing process under non-illuminated conditions, the embodiment of the present application performs curing under lighting conditions, and the curing time used to achieve the same external quantum efficiency (EQE) can be shortened by at least 50%, or even Shorten by 90%. On the other hand, compared to the curing process under non-illumination conditions, the embodiment of the present application electrifies the cathode and anode of the quantum dot light-emitting diode, and performs a light irradiation treatment on the quantum dot light-emitting diode to obtain a quantum dot light-emitting diode, the external quantum efficiency of the quantum dot light-emitting diode can be improved to 6.6%, which can effectively improve the luminous efficiency of the quantum dot light-emitting diode device. More importantly, the curing time required for the quantum dot light-emitting diode in the embodiments of the present application when the external quantum efficiency reaches 6.6% is (at most) only 30% of the time required for the curing process under non-illuminated conditions to reach the highest external quantum efficiency.

Specifically, in the above step S01, the basic structure of the quantum dot light-emitting diode at least includes a cathode and an anode disposed oppositely, and a quantum dot light-emitting layer arranged between the cathode and the anode. At least one of the cathode and the anode is a transparent electrode, so that the quantum dot light-emitting diode can emit light. The cathode can be a conventional cathode material for the light-emitting diode, and the anode can be a conventional anode material for the light-emitting diode. In some embodiments, the anode may be ITO, but it is not limited thereto. In some embodiments, the cathode may be a metal electrode, including but not limited to a silver electrode and an aluminum electrode. The thickness of the cathode is 60-120 nm, and in some embodiments of the present application, it is 100 nm. In some embodiments, the quantum dot light-emitting layer may be made of conventional quantum dot light-emitting materials, and the thickness of the quantum dot light-emitting layer is 30-50 nm.

In some embodiments, the quantum dot light-emitting diode includes a substrate, and the cathode or the anode is disposed on the substrate. When the anode is arranged on the substrate, the quantum dot light-emitting diode forms an upright light-emitting diode; when the cathode is arranged on the substrate, the quantum dot light-emitting diode forms an inverted light-emitting diode. In an exemplary embodiment, the quantum dot light-emitting diode includes a substrate, an anode disposed on the substrate, a quantum dot light-emitting layer provided on a side of the anode away from the substrate, and a cathode disposed on a side of the quantum dot light-emitting layer away from the anode. The selection of the substrate is not strictly limited, a rigid substrate such as a glass substrate can be used; a flexible substrate such as a polyimide substrate and a polynorbornene substrate can also be used, but it is not limited thereto.

In order to obtain better device performance, in the embodiments of the present application, different functional layers are introduced into the basic structure of the quantum dot light-emitting diode to balance carriers.

In some embodiments, the quantum dot light-emitting diode further includes an electron function layer arranged between the cathode and the quantum dot light-emitting layer, in which, the electron function layer includes at least one of an electron injection layer, an electron transport layer and a hole barrier layer. In some embodiments, the electron function layer includes the electron injection layer; in some embodiments, the electron function layer includes the electron transport layer; and in some embodiments, the electron function layer includes the hole barrier layer. In which, the electron injection layer and the electron transport layer are configured to reduce the difficulty of electron injection, and the hole barrier layer is configured to block excess holes so that the excess holes cannot reach the cathode to form a leakage current, thereby improving a current efficiency of the quantum dot light-emitting diode. In some embodiments of the present application, on the basis of the quantum dot light-emitting diode basic structure, it further includes an electron injection layer and an electron transport layer arranged between the quantum dot light-emitting layer and the cathode, where the electron injection layer is arranged adjacent to the cathode, and the electron transport layer is arranged adjacent to the quantum dot light-emitting layer. In which, the electron injection layer may be made of conventional electron hole injection materials, including but not limited to LiF and CsF, and the thickness of the electron transport layer is 10-100 nm. The electron transport layer may be made of conventional electron transport materials, including but not limited to n-type zinc oxide, and the electron transport layer has a thickness of 10-100 nm.

In some embodiments, the quantum dot light-emitting diode further includes a hole function layer arranged between the anode and the quantum dot light-emitting layer, where the hole function layer includes at least one of a hole injection layer, a hole transport layer and an electron barrier layer. In some embodiments, the hole function layer includes the hole injection layer; in some embodiments, the hole function layer includes the hole transport layer; in some embodiments, the hole function layer includes the electron barrier layer. In which, the hole injection layer and the hole transport layer are configured to reduce the difficulty of hole injection, and the electron barrier layer is configured to block excess electrons so that the excess electrons cannot reach the anode to form a leakage current, thereby improving the current efficiency of the quantum dot light-emitting diode. In some embodiments of the present application, on the basis of the quantum dot light-emitting diode basic structure, it further includes a hole injection layer and a hole transport layer arranged between the quantum dot light-emitting layer and the anode, and the hole injection layer is arranged adjacent to the anode, and the hole transport layer is arranged adjacent to the quantum dot light-emitting layer. In which, the hole injection layer may be made of conventional hole injection materials, including but not limited to PEDOT:PSS, and the hole transport layer has a thickness of 10-100 nm.

In some embodiments, the quantum dot light-emitting diode includes both a hole function layer and an electron function layer. In some embodiments of the present application, the quantum dot light-emitting diode includes a cathode and an anode disposed oppositely; a quantum dot light-emitting layer arranged between the cathode and the anode; an electron injection layer and an electron transport layer arranged between the cathode and the quantum dot light-emitting layer quantum dot, where the electron injection layer is arranged adjacent to the cathode, the electron transport layer is arranged adjacent to the quantum dot light-emitting layer; and a hole injection layer and a hole transport layer arranged between the anode and the quantum dot light-emitting layer, where the hole injection layer is arranged adjacent to the anode, and the hole transport layer is arranged adjacent to the quantum dot light-emitting layer. The hole transport layer may be made of conventional hole transport materials, including but not limited to organic materials such as NPB and TFB, and inorganic materials such as NiO, MoO3 and their composites. The thickness of the hole transport layer is 10-100 nm.

In the above step S02, the quantum dot light-emitting diode is subjected to a post-processing to curing the quantum dot light-emitting diode. In particular, in the embodiment of the present application, the quantum dot light-emitting diode is subjected to a curing process under illumination conditions. Specifically, the quantum dot light-emitting diode is placed in an environment provided with a light source, the cathode and anode of the quantum dot light-emitting diode are energized, and the quantum dot light-emitting diode is subjected to light irradiation treatment. The curing process of the quantum dot light-emitting diode under an action of light can greatly shorten the curing time of the quantum dot light-emitting diode, thereby shortening the production period of the device; and the effect of the curing process, compared to the curing process under the non-illumination condition, can be improved, such that it is beneficial to improve the luminous efficiency of the quantum dot light-emitting diode.

In the embodiments of the present application, the quantum dot light-emitting diode is energized by using the energized conditions of conventional curing, and only the cathode and the anode of the quantum dot light-emitting diode are energized. The selection of external power supply is not strictly limited, and it may be selected according to different quantum dot light-emitting diode scales.

In the embodiment of the present application, performing the light irradiation treatment on the quantum dot light-emitting diode requires that the quantum dot light-emitting diode is in an environment with a light source, and there is no strict limitation on the specific illumination mode.

In an exemplary embodiment, the method for placing the quantum dot light-emitting diode in an environment that is provided with a light source, energizing the cathode and anode of the quantum dot light-emitting diode, and performing a light irradiation treatment on the quantum dot light-emitting diode includes that the cathode or anode of the quantum dot light-emitting diode is arranged as a transparent electrode, and the light source for the light irradiation treatment is arranged on the side close to the transparent electrode. At this time, the light emitted from the light source can penetrate the transparent electrode to illuminate the functional layers (including at least the quantum dot light-emitting layer) of the quantum dot light-emitting diode, thereby illuminating the functional layer of the quantum dot light-emitting diode to the maximum limit, improving the external quantum efficiency and improving the effect of light curing. Here, the transparent electrode is provided based on the situation of the quantum dot light-emitting diode. When the cathode is a transparent electrode, a light source is arranged above the cathode; when the anode is a transparent electrode, a light source is arranged above the anode.

In another exemplary embodiment, the method for placing the quantum dot light-emitting diode in an environment provided with a light source, energizing the cathode and anode of the quantum dot light-emitting diode, and performing a light irradiation treatment on the quantum dot light-emitting diode includes: energizing the cathode and anode of the quantum dot light-emitting diode, and performing the light irradiation treatment on the quantum dot light-emitting diode in a sealed cavity, in which a material for an inner wall surface of the sealed cavity is a material with light reflection performance. Through a reflection of the reflective material of the inner wall of the sealed cavity, the light emitted by the light source can be irradiated on the surface of the quantum dot light-emitting diode as much as possible, and the irradiation rate of the quantum dot light-emitting diode is improved, thereby improving the external quantum efficiency of the quantum dot light-emitting diode, as well as the effect of light curing.

In the embodiment of the present application, the emission wavelength of the light source applied in the light irradiation treatment has a certain influence on the light-curing effect. In some embodiments, the light source for the light irradiation treatment is selected from ultraviolet light with an emission wavelength of 100-400 nm. In some embodiments, the light source for the light irradiation treatment is selected from visible light with an emission wavelength of 400-500 nm. In some embodiments, the light source for the light irradiation treatment is selected from ultraviolet light with an emission wavelength of 100-400 nm and visible light with an emission wavelength of 400-500 nm. When the emission wavelength of the light source for the light irradiation treatment is selected from the above two wavelength bands, the quantum dot light-emitting diode has a better curing effect, and the external quantum efficiency of the quantum dot light-emitting diode can be improved in a short time, thereby improving the luminous efficiency of the device. effectiveness. If the emitted light of the light source is below 100 nm, it will cause damage to the quantum dot light-emitting diode device, and the device is prone to aging; if the light emitted by the light source has a wavelength above 500 nm, the curing effect on the quantum dot light-emitting diode is negligible (which can not effectively improve the external quantum efficiency of the quantum dot light-emitting diode).

In the embodiments of the present application, the light intensity has a certain influence on the light-curing effect. In some embodiments, the quantum dot light-emitting diode is placed in an illumination environment with appropriate light intensity, the cathode and anode of the quantum dot light-emitting diode are energized, and the quantum dot light-emitting diode is subjected to the light irradiation treatment. In some embodiments of the present application, the quantum dot light-emitting diode is subjected to a light irradiation treatment under the condition that an illuminance of the light source applied in the light irradiation treatment is 500 lx-50000 lx. If the illuminance is too high, it will have a certain impact on the quantum dot light-emitting diode, to be specific, it will reduce the service life of the quantum dot light-emitting diode; and if the illuminance is too high, the light-curing effect of the quantum dot light-emitting diode is not obvious. Specifically, when the illuminance is small, the time required for light curing (to reach the best external quantum efficiency) is relatively long; when the illuminance is high, the time required for light curing (to reach the best external quantum efficiency) is relatively short. When the quantum dot light-emitting diode reaches the highest external quantum efficiency, its external quantum efficiency will decrease if it continues to be subjected to the light curing process. In some embodiments of the present application, the quantum dot light-emitting diode is subjected to light irradiation treatment under the condition that the illuminance of the light source applied in the light irradiation treatment is 2000 lx-10000 lx, so as to obtain a better light-curing effect.

In the embodiments of the present application, through the light curing process(curing under illumination conditions), the curing time can be effectively shortened (the time used to achieve the same external quantum efficiency is significantly shortened). Specifically, the cathode and anode of the quantum dot light-emitting diode are energized, and the time for irradiating the quantum dot light-emitting diode is 20 minutes to 48 hours. At this time, the external quantum efficiency of the quantum dot light-emitting diode is relatively high, between 3.2% and 6.6%. However, with the extension of time, especially after the light curing time exceeds 20 hours, the external quantum efficiency of the quantum dot light-emitting diode has a downward trend, but it is still between 3.2% and 6.6%. That is, when the quantum dot light-emitting diode reaches the highest external quantum efficiency, its external quantum efficiency will decrease if it continues to be subjected to the light curing process. In some embodiments of the present application, the duration of the energization treatment under illumination conditions is 10 hours to 20 hours, so as to obtain a relatively higher external quantum efficiency.

In the embodiments of the present application, the step of energizing the cathode and anode of the quantum dot light-emitting diode and performing a light irradiation treatment on the quantum dot light-emitting diode is implemented under a condition of a temperature of −40° C. to 40° C., that is, the temperature of the light curing treatment is −40° C.-40° C., which can obtain a more obvious light-curing effect. If the temperature is too high, the damage to the device will be greater, which will affect the performance of the device; if the temperature is too low, the light-curing effect may be negligible. In some embodiments of the present application, the step of energizing the cathode and anode of the quantum dot light-emitting diode and performing the light irradiation treatment on the quantum dot light-emitting diode is implemented under the condition of a temperature of 0° C. to 30° C., thereby obtaining more significant light-curing effect.

The description will be given below in conjunction with specific embodiments.

EXAMPLE 1

A post-processing method of a quantum dot light-emitting diode includes the following steps:

Providing 5 quantum dot light-emitting diodes of the same structure and specification (numbered 1, 2, 3, 4, and 5 respectively). The quantum dot light-emitting diode includes an anode (ITO) and a cathode (metal aluminum electrode) arranged opposite to each other. A functional laminate structure between the anode and the cathode, the functional laminate structure including a hole injection layer (PEDOT:PSS), a hole transport layer (TFB), a quantum dot light-emitting layer (CdSe/ZnS QDs), an electron transport layer (ZnO) and a electron injection layer (LiF), stacked in sequence from the anode to the cathode, in which the anode is arranged on a glass substrate.

An external power supply is connected to the five quantum dot light-emitting diodes, and the cathode and anode of the quantum dot light-emitting diode are energized. The quantum dot light-emitting diodes numbered 1-4 are subjected to the light irradiation treatment, and the light source applied in the light irradiation treatment is selected from the blue light with an emission wavelength of 400 nm, and the quantum dot light-emitting diode numbered 5 is not subjected to the light irradiation treatment.

The EQE (external quantum efficiency, %) of the five quantum dot light-emitting diodes that have undergone the curing process at different illuminances and different time periods was tested, and the results are shown in Table 1 below.

TABLE 1

| Device No. | Illuminance (1×) | 1 h | 10 h | 20 h | 30 h | 1 day later | 2 days later | 3 days later | 4 days later |
|---|---|---|---|---|---|---|---|---|---|
| 5 | Non-illuminated condition | | | | | 3.0 | 4.9 | 6.1 | 5.8 |
| 1-4 (Illuminated) | 2000 | 2.4 | 4.9 | 5.8 | 5.7 | | | | |
| | 5000 | 3.3 | 5.3 | 5.9 | 6.0 | | | | |
| | 8000 | 3.2 | 6.5 | 6.6 | 6.4 | | | | |
| | 10000 | 3.8 | 6.1 | 6.3 | 5.9 | | | | |

It can be seen from Table 1 that the EQE of the quantum dot light-emitting diode No. 5, which has not been subjected to a light irradiation treatment, reaches the highest value (6.1%) after 3 days of curing. For the quantum dot light-emitting diodes cured under illumination conditions, after 10 hours of the curing treatment, the EQE thereof and the EQE of the blank sample numbered 5 were basically the same, or even slightly improved; 10 hours later, the change was small and basically stable. Compared with the blank comparative sample No. 5, the light-curing process provided in the embodiments of the present application can reach the curing standard in advance, thereby greatly improving the production period of quantum dot light-emitting diodes.

EXAMPLE 2

A post-processing method of a quantum dot light-emitting diode includes the following steps:

Provide 5 quantum dot light-emitting diodes of the same structure and specification (numbered 6, 7, 8, 9, and 10 respectively). The quantum dot light-emitting diode includes an anode (ITO) and a cathode (metal aluminum electrode) arranged opposite to each other. A functional laminate structure between the anode and the cathode, the functional laminate structure including a hole injection layer (PEDOT:PSS), a hole transport layer (TFB), a quantum dot light-emitting layer (CdSe/ZnS QDs), an electron transport layer (ZnO) and an electron injection layer (LiF) stacked in sequence from the anode to the cathode, in which the anode is arranged on a glass substrate.

The cathode and anode of the quantum dot light-emitting diode are energized. The quantum dot light-emitting diodes numbered 6-9 are subjected to the light irradiation treatment, the light source applied in the light irradiation treatment is selected from the blue light with an emission wavelength of 400 nm, and the illuminance of the light source applied in the light irradiation treatment is 8000 lx; the quantum dot light-emitting diode numbered 10 is not subjected to the light irradiation treatment.

The EQE (external quantum efficiency, %) of the five quantum dot light-emitting diodes that have been cured at different temperatures and time periods was tested, and the results are shown in Table 2 below.

TABLE 2

| Device No. | Temperature (° C.) | 1 h | 10 h | 20 h | 30 h | 1 day later | 2 days later | 3 days later | 4 days later |
|---|---|---|---|---|---|---|---|---|---|
| 10 (Non-illuminated) | 20 | | | | | 3.0 | 4.9 | 6.1 | 5.8 |
| 6-9 (Illuminated) | 0 | 3.2 | 6.5 | 6.6 | 6.4 | | | | |
| | 10 | 3.1 | 5.7 | 5.9 | 5.7 | | | | |
| | 20 | 3.5 | 6.2 | 5.6 | 5.8 | | | | |
| | 30 | 3.7 | 6.0 | 5.7 | 5.4 | | | | |

It can be seen from Table 2 that the EQE of the quantum dot light-emitting diode No. 10 that has not been subjected to the light irradiation treatment reaches the highest value (6.1%) after 3 days of curing. For the quantum dot light-emitting diodes cured under illumination conditions, after 10 hours of the curing treatment, the EQE thereof and the EQE of the blank sample numbered 10 were basically the same, or even slightly improved; after 10 hours, the change was small and basically stable. Compared with the blank comparative sample No. 10, the embodiments of the present application, by controlling the temperature of the light-curing, the curing rate and the final EQE peak can be affected in a certain extent; the change after light curing for 10 hours is small and basically stable. Compared with the blank comparative sample, it can reach the curing standard in advance, thereby greatly improving the production period of QLED devices.

The above embodiments are optional embodiments of the present application, which are not used to limit the present application. For those skilled in the art, the present application can have various modifications and changes. Any modification, equivalent replacement, improvement, etc. made within the spirit and principle of the present application shall be included in the scope of the claims of the present application.

The invention claimed is:

1. A post-processing method of a quantum dot light-emitting diode, comprising:
providing a quantum dot light-emitting diode, and the quantum dot light-emitting diode comprising a cathode and an anode disposed oppositely, and a quantum dot light-emitting layer arranged between the cathode and the anode;
energizing the cathode and anode of the quantum dot light-emitting diode, and performing a light irradiation treatment on the quantum dot light-emitting diode.

2. The post-processing method of a quantum dot light-emitting diode according to claim 1, wherein a light source applied in the light irradiation treatment is selected from ultraviolet light with an emission wavelength of 100-400 nm.

3. The post-processing method of a quantum dot light-emitting diode according to claim 1, wherein a light source applied in the light irradiation treatment is selected from visible light with an emission wavelength of 400-500 nm.

4. The post-processing method of a quantum dot light-emitting diode according to claim 1, wherein the quantum dot light-emitting diode is subjected to a light irradiation treatment, and an illuminance of the light source applied in the light irradiation treatment is between 500 lx and 50000 lx.

5. The post-processing method of a quantum dot light-emitting diode according to claim 4, wherein the quantum dot light-emitting diode is subjected to a light irradiation treatment, and the illuminance of the light source applied in the light irradiation treatment is between 2000 lx and 10000 lx.

6. The post-processing method of a quantum dot light-emitting diode according to claim 1, wherein the cathode or anode of the quantum dot light-emitting diode is arranged as a transparent electrode, and the light source applied in the light irradiation treatment is arranged at a side close to the transparent electrode.

7. The post-processing method of a quantum dot light-emitting diode according to claim 1, wherein energizing the cathode and anode of the quantum dot light-emitting diode, and performing the light irradiation treatment on the quantum dot light-emitting diode in a sealed cavity, and a material for an inner wall surface of the sealed cavity is a material with light reflection performance.

8. The post-processing method of a quantum dot light-emitting diode according to claim 1, wherein energizing the cathode and anode of the quantum dot light-emitting diode, and performing the light irradiation treatment on the quantum dot light-emitting diode for 20 minutes-48 hours.

9. The post-processing method of a quantum dot light-emitting diode according to claim 8, wherein energizing the cathode and anode of the quantum dot light-emitting diode, and performing the light irradiation treatment on the quantum dot light-emitting diode for 10 hours-20 hours.

10. The post-processing method of a quantum dot light-emitting diode according to claim 1, wherein energizing the cathode and anode of the quantum dot light-emitting diode, and performing the light irradiation treatment on the quantum dot light-emitting diode under a temperature of $-40°$ C. to $40°$ C.

11. The post-processing method of a quantum dot light-emitting diode according to claim 10, wherein energizing the cathode and anode of the quantum dot light-emitting diode, and performing the light irradiation treatment on the quantum dot light-emitting diode under the temperature of $0°$ C.-$30°$ C.

12. The post-processing method of a quantum dot light-emitting diode according to claim 1, wherein at least one of the cathode and the anode is a transparent electrode.

13. The post-processing method of a quantum dot light-emitting diode according to claim 1, wherein the quantum dot light-emitting diode further comprises an electron function layer arranged between the cathode and the quantum dot light-emitting layer, wherein the electron function layer comprises at least one of an electron injection layer, an electron transport layer and a hole barrier layer.

14. The post-processing method of a quantum dot light-emitting diode according to claim 1, wherein the quantum dot light-emitting diode further comprises a hole function layer arranged between the anode and the quantum dot light-emitting layer, wherein the hole function layer comprises at least one of a hole injection layer, a hole transport layer and an electron barrier layer.

15. The post-processing method of a quantum dot light-emitting diode according to claim 1, wherein the quantum dot light-emitting diode comprises both a hole function layer and an electron function layer.

16. The post-processing method of a quantum dot light-emitting diode according to claim 1, wherein the quantum dot light-emitting diode further comprises an electron injection layer and an electron transport layer arranged between the cathode and the quantum dot light-emitting layer, and a hole injection layer and a hole transport layer arranged between the anode and the quantum dot light-emitting layer, wherein the electron injection layer is disposed adjacent to the cathode, the electron transport layer is disposed adjacent to the quantum dot light-emitting layer, the hole injection layer is disposed adjacent to the anode, and the hole transport layer is arranged adjacent to the quantum dot light-emitting layer.

* * * * *